United States Patent
Khoche et al.

(10) Patent No.: US 9,146,274 B2
(45) Date of Patent: Sep. 29, 2015

(54) WAFER BOAT FOR SEMICONDUCTOR TESTING

(75) Inventors: Ajay Khoche, San Jose, CA (US);
Duncan Gurley, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 1564 days.

(21) Appl. No.: 11/895,590

(22) Filed: Aug. 24, 2007

(65) Prior Publication Data

US 2009/0053837 A1 Feb. 26, 2009

(51) Int. Cl.
*H01L 21/66* (2006.01)
*G01R 31/28* (2006.01)

(52) U.S. Cl.
CPC ........ *G01R 31/2893* (2013.01); *G01R 31/2831* (2013.01)

(58) Field of Classification Search
CPC ........... H01L 2224/32225; H01L 2224/48227; H01L 2224/73265; H01L 2224/73204
USPC ........................ 438/14, 10, 17, 601, 129, 199
See application file for complete search history.

(56) References Cited

U.S. PATENT DOCUMENTS

| 4,597,708 | A | 7/1986 | Wheeler et al. |
| 6,407,559 | B1 | 6/2002 | Pasch |
| 6,993,405 | B2 * | 1/2006 | Beaulieu et al. ............... 700/116 |
| 2006/0068512 | A1 * | 3/2006 | Ohshima et al. ................ 438/14 |
| 2006/0132167 | A1 * | 6/2006 | Chen .............................. 324/765 |
| 2007/0170267 | A1 * | 7/2007 | Kang et al. .................... 235/492 |

FOREIGN PATENT DOCUMENTS

| WO | WO2007/013386 | 2/2007 |
| WO | 2009029455 A1 | 3/2009 |

OTHER PUBLICATIONS

International Search Report and Written Opinion mailed on Nov. 12, 2008 for PCT Application No. PCT/US2008/073744.

* cited by examiner

*Primary Examiner* — Chuong A Luu
*Assistant Examiner* — Rodolfo Fortich

(57) ABSTRACT

In accordance with one embodiment of the invention, a method and apparatus are provided for testing a wafer while the wafer is disposed in a wafer carrier. The test results can be utilized to adjust the manufacturing process and thereby increase processing yield.

17 Claims, 9 Drawing Sheets

WAFER BOAT FOR SEMICONDUCTOR TESTING

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND

The manufacturing of semiconductor wafers is a highly automated process involving many steps and locations where a wafer is processed. In fact, the manufacturing can take place across different manufacturing buildings and different portions of a country or even in multiple countries. A wafer carrier or "wafer boat" has evolved that is often used to carry wafers during the manufacturing process. Such wafer carriers are configured to allow automated handling of the wafers at individual manufacturing locations and to protect the wafer from physical forces as well as electrical damage. A wafer will often be carried by the same wafer carrier between many steps of the manufacturing process, if not between all steps. At each processing step, the wafer is removed from the carrier and processed before being redeposited back in the wafer carrier.

Testing of wafers is now a significant percentage of the cost of semiconductor manufacturing. As circuits have become increasingly more sophisticated, the testing involved for such circuits has also increased. Furthermore, wafers are often manufactured with dense numbers of individual dies on a single wafer. Thus, a single wafer can hold multiple dies which each hold an individual circuit. Thus, multiple circuits are manufactured on a single wafer so that the wafer can later be divided into individual chips.

Due to the significant cost involved in producing semiconductor chips as well as the significant cost of testing such semiconductor chips, it would be beneficial if there were a way to reduce the amount of testing required on a chip when the manufacturing process is completed. Similarly, it would be beneficial if there were a way to identify early in a manufacturing process an effective manufacturing step that could be remedied before a wafer was completed. Moreover, it would be beneficial if there were a way to determine that repairable chips are defective while they are still in the manufacturing process so that the manufacturing yield could be improved for the overall process.

SUMMARY

In accordance with one embodiment of the invention, a method of testing semiconductor wafers is provided that comprises providing a wafer carrier; disposing a wafer in the wafer carrier; moving the wafer carrier and the wafer between a first manufacturing location and a second manufacturing location; testing the wafer while the wafer is disposed in the wafer carrier; and performing that test after completion of the manufacturing operations at the first manufacturing location but before manufacturing operations commence at the second manufacturing location.

In accordance with another aspect of the invention, upstream manufacturing processes can be adjusted based upon initial feedback from such wafer testing that takes place in a wafer carrier. Similarly, in accordance with another aspect of the invention, downstream adjustments can be performed in the wafer manufacturing process so as to create higher yield and/or repair of wafers.

In accordance with another embodiment of the invention, an apparatus for testing wafers is provided that comprises a wafer carrier; and, a test circuit disposed on the wafer carrier, wherein the test circuit is configured to perform testing on the wafer while the wafer is being carried by the wafer carrier between manufacturing operations.

In accordance with one aspect of the invention, a physical connection can be utilized to conduct the wafer testing in the wafer carrier. In accordance with another aspect, wireless stimulation can be utilized to stimulate a built-in self-test circuit on each wafer die. Similarly, in accordance with another aspect of the invention, an optical-powered circuit could be utilized in the wafer dies to test the wafer dies. And optical transmitters in the dies could be utilized to return test data to the wafer carrier.

In accordance with another aspect of the invention, the wafer carrier can be configured with a transmitter to transmit initial test data to a remote receiver where the test data can be processed further and utilized to adjust the manufacturing process.

In accordance with another embodiment of the invention, the wafer carrier can receive reduced test code to allow the wafer carrier to apply testing schemes between manufacturing processes. In effect, the wafer carrier tester operates as a thin client in this mode.

Further embodiments of the invention will be apparent from review of the specification and drawings and appended claims.

DETAILED DESCRIPTION

Figure 1:
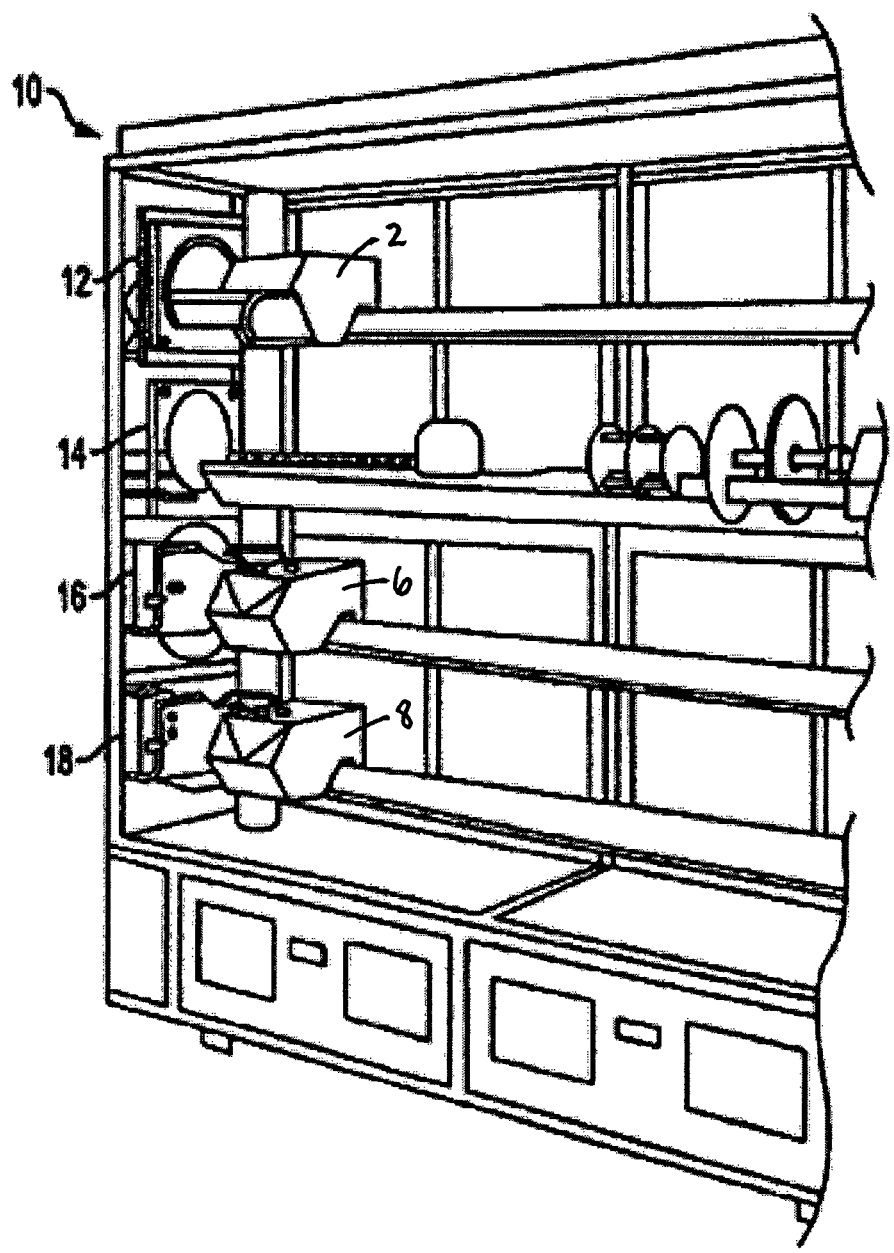
FIG. 1 illustrates an existing example of a wafer carrier system.

Referring now to FIG. 1, an example of an existing wafer boat system 10 can be seen. Wafer carriers are shown as elements 2, 6, and 8. The wafer boat carriers are carried on conveyor systems 12, 14, 16, and 18 for purposes of moving the wafers through an assembly line. In the past, such wafer carriers performed only the function of transporting a wafer between different manufacturing steps. The wafer carriers served to protect the wafers but did not perform any testing while the wafers were disposed within the wafer carriers.

However, there is a significant amount of time between processing steps in which no processing is taking place on the wafer. For example, some manufacturers transport wafer carriers between different manufacturing buildings in different cities. Thus, the wafer can spend a significant amount of time in transit while sitting in its wafer carrier. At the end of the manufacturing process or at intermediate times during the manufacturing process, the wafer can be removed from the wafer carrier to have tests performed upon the wafer. However, such testing requires dedicated testing facilities and expensive test machinery to implement the testing. Furthermore, the amount of time involved with such testing is a significant portion of the cost of producing the semiconductor products.

Thus, in accordance with one embodiment of the invention, a test circuit can be included with the wafer carrier so as to permit some test routines to be implemented while the wafer is disposed within the wafer carrier. In accordance with one embodiment of the invention, this will allow reduced testing since some testing can be performed prior to the wafer arriving at the dedicated test station. In accordance with another embodiment of the invention, the test data obtained while the wafer is in the wafer carrier can be utilized to adjust the manufacturing process and even to repair defective semiconductor products with subsequent manufacturing steps. Furthermore, such adjustments to the manufacturing process can take place earlier rather than later and thus improve the manufacturing process for other wafers proceeding through the manufacturing process without waiting for the initial wafer to be completely processed and tested.

Figure 2:
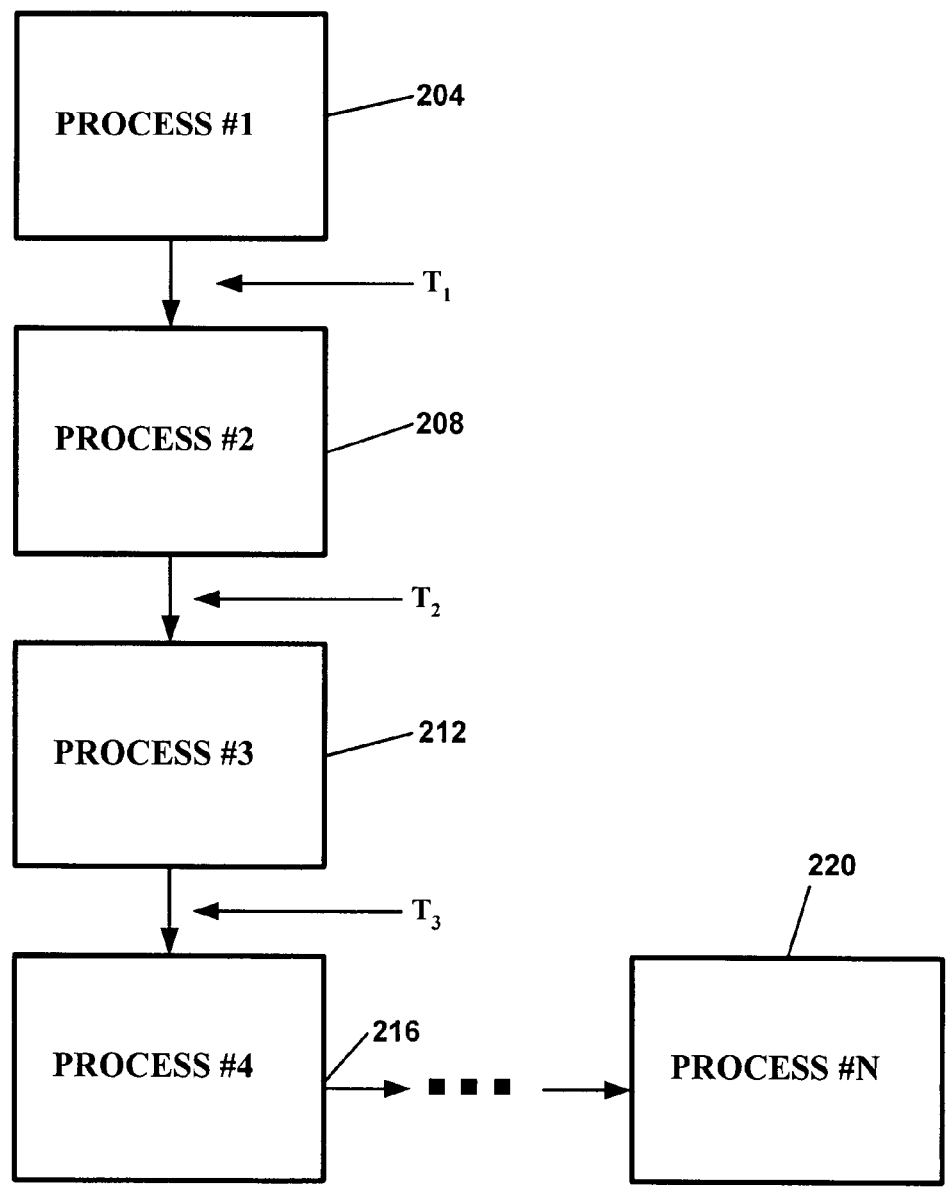
FIG. 2 illustrates exemplary process steps utilized in wafer manufacturing.

Referring now to FIG. 2, an exemplary manufacturing process is shown. Processes 1, 2, 3, 4, and N are indicated by blocks 204, 208, 212, 216, and 220, respectively. This manufacturing process is shown as being comprised of multiple processes used to produce a wafer. The arrows shown between each process represent transit time when the wafer is disposed in the wafer carrier between processes. Furthermore, the arrows labeled $T_1$ $T_2$ and $T_3$ represent tests that can be implemented between the different processes while the wafer is disposed in the wafer carrier. It is not necessary that a test be performed between each manufacturing process. Rather, the tests are merely exemplary to show the tests could be performed if desired.

For example, if the processes involved were the deposition of different metal layers and connecting via's, testing could be implemented after the deposition or polishing of each metal layer. However, it should be understood that for purposes of this patent that testing could be implemented at any manufacturing stage while the wafer is disposed in the wafer carrier. Furthermore, a manufacturing process is understood to include dedicated testing processes performed on the wafer when the wafer is removed from the wafer carrier.

Figure 3:
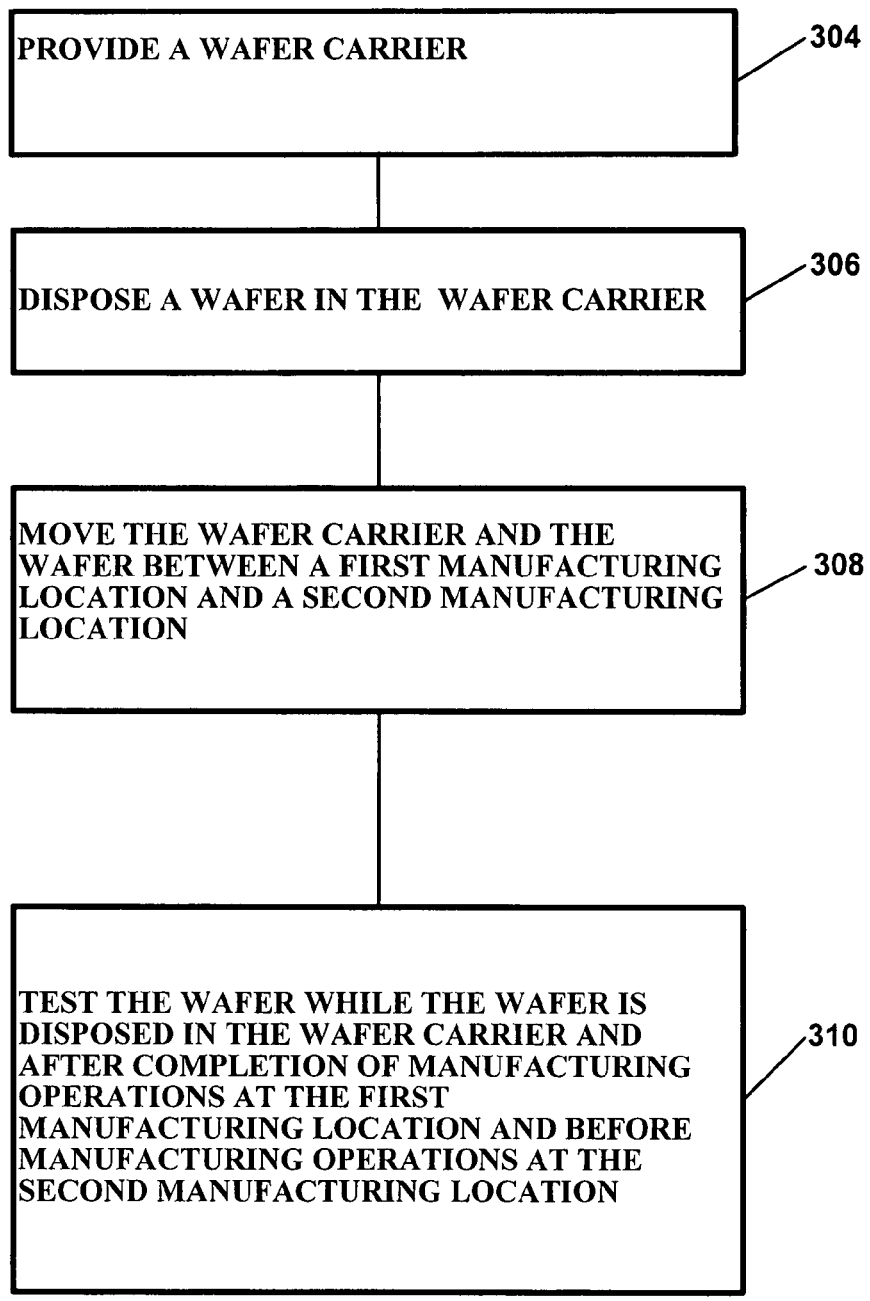
FIG. 3 illustrates a flow chart demonstrating a method of conducting wafer carrier testing in accordance with one embodiment of the invention.

Referring now to FIG. 3, an example of a method of implementing a wafer carrier testing scheme is illustrated by flow chart 300. Flow chart 300 shows in block 304 that a wafer carrier is provided. It is understood that this wafer carrier is configured with a test circuit that can be utilized to perform testing on the wafer while the wafer is present in the wafer carrier. In block 306, a wafer is introduced and disposed in the wafer carrier. In block 308, the wafer carrier and the wafer are then moved between different manufacturing processes, such as a first manufacturing process or location and a second manufacturing process or location. In block 310, the wafer is tested in the wafer carrier and this testing is performed after completion of manufacturing steps or operations at the first manufacturing location or step and before manufacturing operations at the second manufacturing location or step.

Figure 4A:
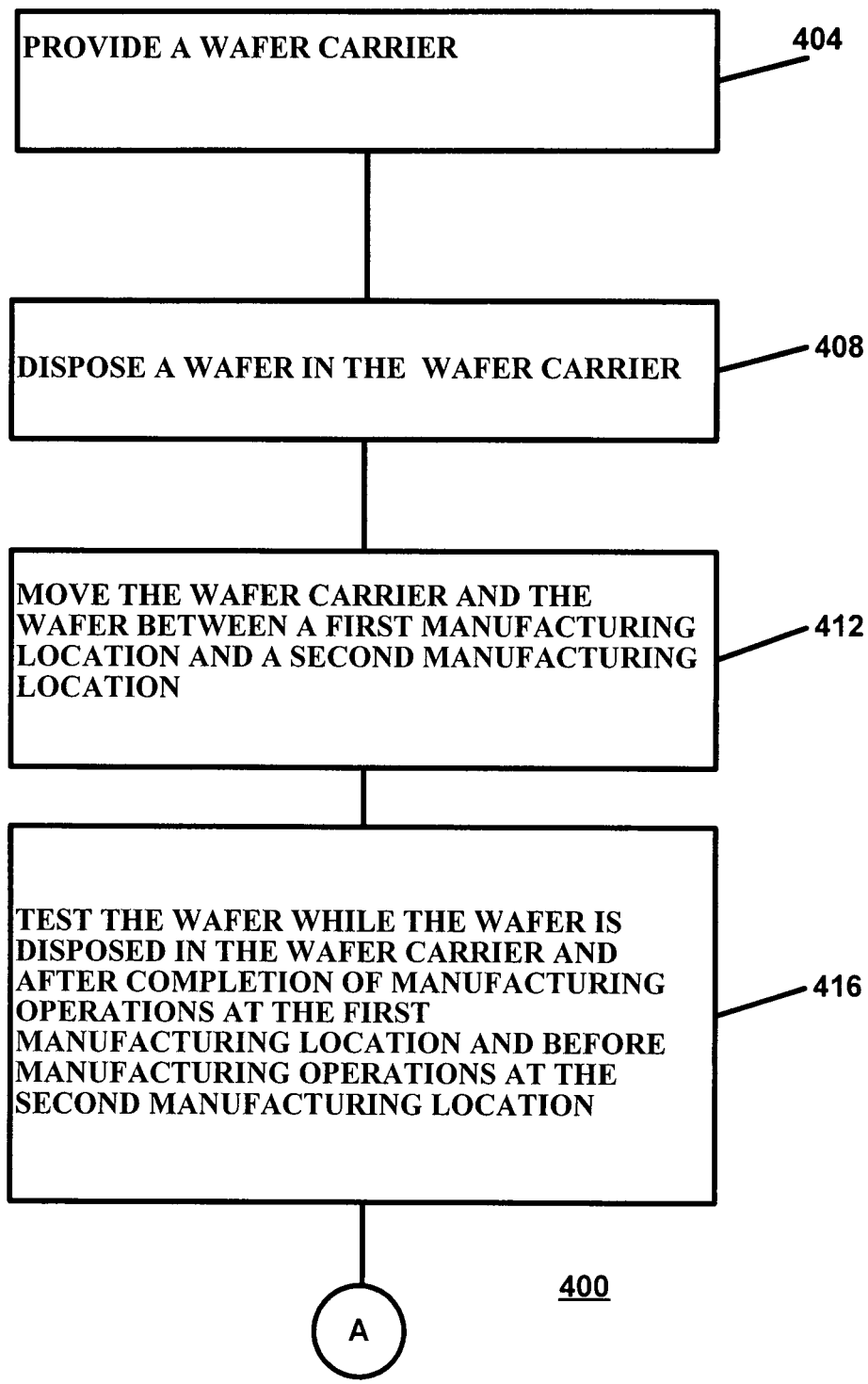
FIGS. 4a, 4b and 4c illustrate a flow chart demonstrating a method of testing wafers in a wafer carrier in accordance with one embodiment of the invention.
Figure 4B:
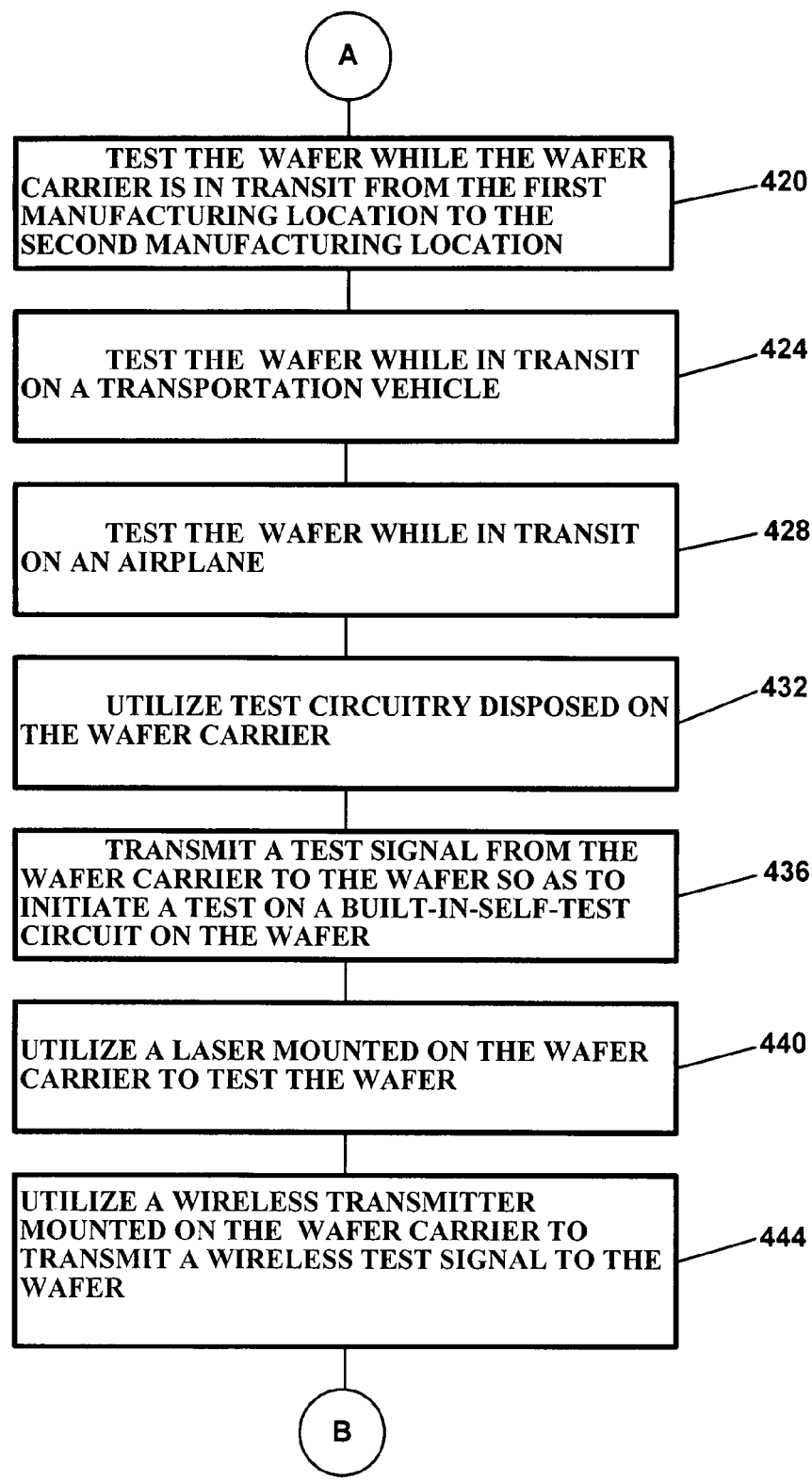
Figure 4C:
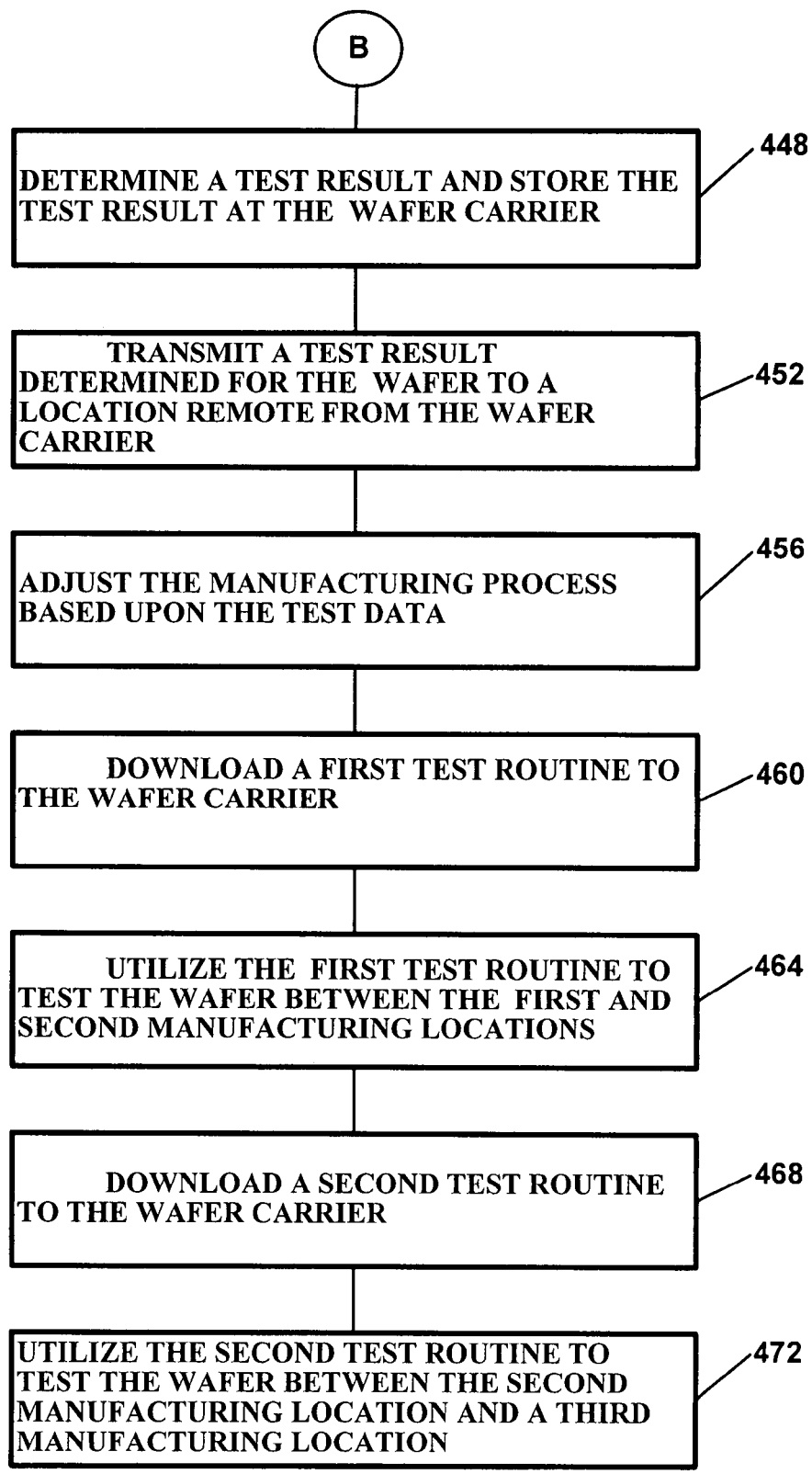

A more detailed example of a testing process is shown by FIGS. 4a, 4b, and 4c. Flow chart 400 shows a flow chart demonstrating such a method. In block 404, a wafer carrier is provided. A wafer is then disposed in the wafer carrier as shown in block 408. The wafer carrier and wafer are then moved between a first manufacturing location and a second manufacturing location, as shown in block 412. It should be understood that use of the words "first" and "second" do not mean initial and subsequent, rather they merely refer to two steps in the wafer manufacturing process. In block 416, the wafer is tested while the wafer is disposed in the wafer carrier and between manufacturing operations or steps. Block 420 expands upon the testing that can be performed in the wafer carrier. For example, the wafer can be tested while it is in transit from a first manufacturing location to a second manufacturing location. For example, as shown in block 424, the wafer can be tested while in transit on a transportation vehicle such as a truck or train. Similarly, as shown in block 428, the wafer can be tested while in transit on an airplane.

To conduct the testing, test circuitry disposed on the wafer carrier can be utilized. Such test circuitry does not appear to exist in current systems. While current systems might utilize RFID tagging to identify a wafer carrier, they do not utilize test equipment that can be used to test a wafer while the wafer is disposed in the wafer carrier. Thus, block 432 shows that such test circuitry is disposed on the wafer carrier for use in testing the wafer itself.

To conduct a test, the test circuitry can transmit a test signal from the wafer carrier to the wafer so as to initiate a test on the wafer. A variety of test systems can be utilized to perform testing of the wafer while the wafer is disposed in the wafer carrier. This is particularly true now that remotely activated test circuits can be configured as part of a wafer. For example, a built-in self-test (BIST) circuit can be configured as part of each die on a wafer. Such built-in self-test circuitry can be activated to cause the built-in self-test circuitry to perform a test routine on the die's circuit. This is but one example of how a test could be performed. Additionally, for example, a layer of interconnect could be disposed on a wafer so as to provide a common bus and input/output lines to each die so as to permit testing of each die at a basic electrical level. In such an instance, a direct contact could be made between the wafer carrier test circuit and the wafer so as to provide power and input/output capability.

Built-in self-test circuitry could also be activated using optical or wireless signals. For example, a laser could be utilized so as to be directed incident to an optical receiver on the wafer. The power provided by the laser beam could then be utilized to power a test circuit on each individual die. Each individual die could be configured with a light-emitting diode (LED) so as to transmit response signals to the test circuitry. Alternatively, a signal could be transmitted in a wireless fashion using radio frequency signals, as are well understood in the art, to power a coil configured as part of the semiconductor die. This coil could be utilized to power a test circuit configured as part of each die. Each die could then return a response signal so as to transmit the test data back to the wafer carrier test circuit.

While the wafer and wafer carrier are in transit, especially during long downtimes between manufacturing steps, each individual die could be individually tested to determine some test information. This allows for low-power usage on the wafer carrier test circuit and provides sufficient time for at least a portion or perhaps all of the wafer to be tested while the wafer is disposed in the wafer carrier.

Thus, flow chart 400 shows in block 436 that a test signal can be transmitted from the wafer carrier to the wafer so as to initiate a test on a test circuit on the wafer. Furthermore, as noted above, block 440 and 444 illustrate that a laser mounted on the wafer carrier or a wireless transmitter mounted on the wafer carrier could be utilized to initiate the test. Block 448 illustrates that a test result can be determined and stored in memory on the wafer carrier. The wafer carrier can then transmit test results for the wafer from the wafer carrier to a remote location. For example, as the wafer carrier is in transit between wafer manufacturing stations, the wafer carrier can relay the test information to a receiver coupled with a computer that is disposed in proximity to the manufacturing process. This allows a low-power transmitter to be utilized by the wafer carrier in order to relay the test data. Once the test data is determined, the manufacturing process can be adjusted based upon the test data, as shown in block 456.

Block 456 shows that the manufacturing process can be adjusted based upon the test data obtained. For example, the upstream manufacturing parameters can be adjusted when errors are determined on previously processed wafers that are not completed but that are reporting errors determined by tests performed in the wafer carriers. Thus, the test information can be utilized to adjust upstream manufacturing processes. In addition, downstream manufacturing processes can be adjusted as well. For example, if a wafer is determined to be defective, then downstream processing can be programmed into the manufacturing process of such a wafer so as to remedy the defects. Furthermore, individual dies on a particular wafer can be repaired as part of the manufacturing process. In fact, some repairs could be implemented while the wafer is disposed in the wafer carrier itself. For example, a circuit having E-fuse repairability could be repaired using a power source disposed in the wafer carrier while the wafer carrier and wafer were in transit. However, it is envisioned that the more likely scenario will involve adjustment to subsequent manufacturing steps where such repairs can be implemented. In addition, the test data can be utilized to identify bad dies that are unrecoverable and thus to save on test time by not performing further tests upon those defective dies when a dedicated test station is utilized. Furthermore, some testing steps can be eliminated so that the dedicated test station that removes the wafer from the wafer carrier to perform exhaustive testing on the wafer can reduce the number of tests required to be performed. In this fashion, the wafer carrier testing routines saved on the total test time required for a wafer.

Blocks 460, 464, 468 and 472 illustrate that the test circuit can be implemented with essentially a "thin client" configuration. In this configuration, a reduced test set of instructions is stored on the wafer carrier test circuit memory. This first reduced set of instructions is utilized to perform a first test routine between two manufacturing processes as shown in blocks 460 and 464. When the first test routine is completed, a second test routine can be downloaded to the wafer carrier from a remote transmitter and the second test routine code can be stored in the memory of the wafer carrier's test circuit. Then, this second test routine can be utilized to perform additional testing on the wafer such as between subsequent manufacturing processes. In this fashion the wafer carrier can be configured with low memory requirements and store a small set of code particularized to a particular testing situation.

Figure 5:
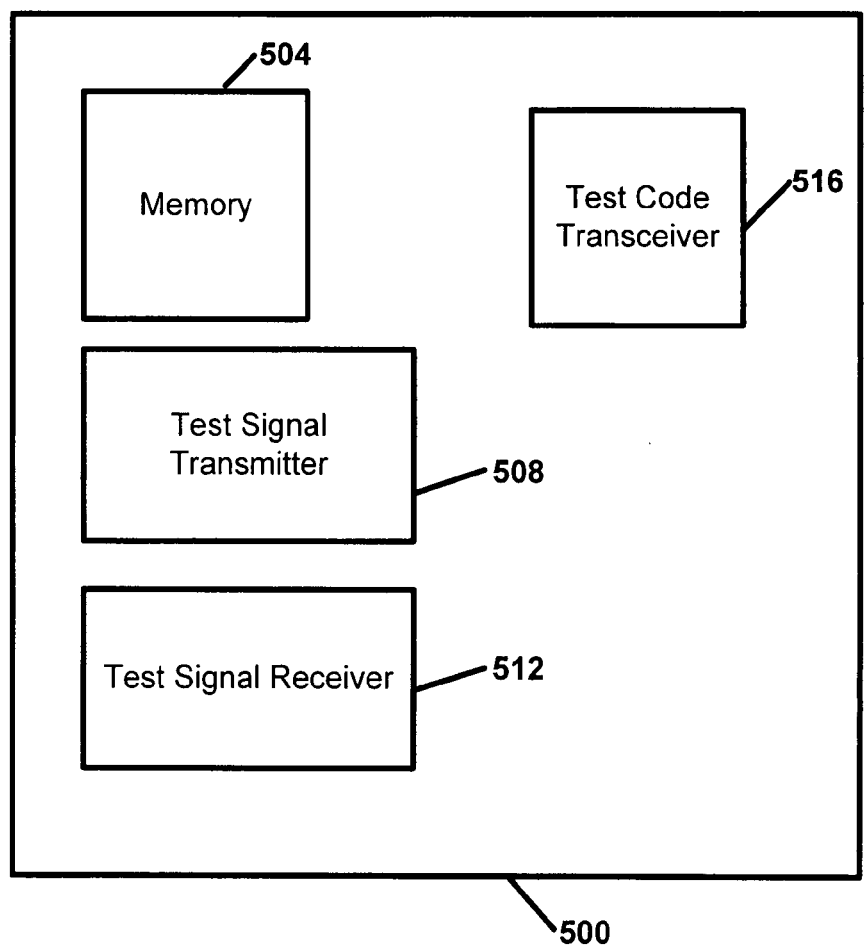
FIG. 5 illustrates a wafer carrier block diagram, including test equipment, in accordance with one embodiment of the invention.

Referring now to FIG. 5, FIG. 5 illustrates a wafer carrier 500, which comprises a memory 504, test signal transmitter 508, test signal receiver 512, test code transceiver 516, as well as a wafer holder and associated transport equipment found on existing wafer carriers. The memory can be utilized to store test routine code as well as test data. The test code can be relayed to the wafer carrier using test code transceiver 516. Furthermore, test code transceiver can be utilized to transmit test data results, to relay stations for example. The test signal transmitter can be utilized to transmit a test input signal to a wafer under test. Furthermore, test signal receiver 512 can be utilized to receive test results back from the wafer.

Figure 6:
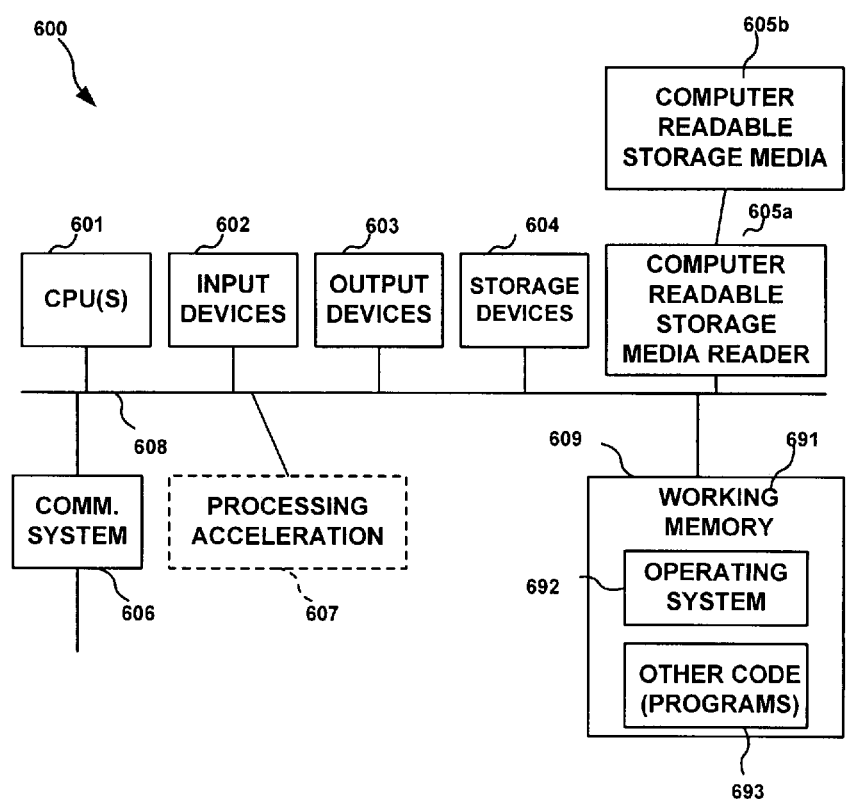
FIG. 6 illustrates a block diagram of a computer system for controlling a wafer carrier in accordance with one embodiment of the invention.

FIG. 6 illustrates a block diagram of a computer system for implementing test circuitry shown in FIG. 5. Furthermore, FIG. 6 illustrates a block diagram of computer systems that can be utilized to relay information from servers or manufacturing computers to each wafer carrier. FIG. 6 broadly illustrates how individual system elements can be implemented. System 600 is shown comprised of hardware elements that are electrically coupled via bus 608, including a processor 601, input device 602, output device 603, storage device 604, computer-readable storage media reader 605a, communications system 606 processing acceleration (e.g., DSP or special-purpose processors) 607 and memory 609. Computer-readable storage media reader 605a is further coupled to computer-readable storage media 605b, the combination comprehensively representing remote, local, fixed and/or removable storage devices plus storage media, memory, etc. for temporarily and/or more permanently containing computer-readable information, which can include storage device 604, memory 609 and/or any other such accessible system 600 resource. System 600 also comprises software elements (shown as being currently located within working memory 691) including an operating system 692 and other code 693, such as programs, applets, data and the like.

System 600 has extensive flexibility and configurability. Thus, for example, a single architecture might be utilized to implement one or more servers that can be further configured in accordance with currently desirable protocols, protocol variations, extensions, etc. However, it will be apparent to those skilled in the art that embodiments may well be utilized in accordance with more specific application requirements. For example, one or more system elements might be implemented as sub-elements within a system 600 component (e.g. within communications system 606). Customized hardware might also be utilized and/or particular elements might be implemented in hardware, software (including so-called "portable software," such as applets) or both. Further, while connection to other computing devices such as network input/output devices (not shown) may be employed, it is to be understood that wired, wireless, modem and/or other connection or connections to other computing devices might also be utilized.

Figure 7:
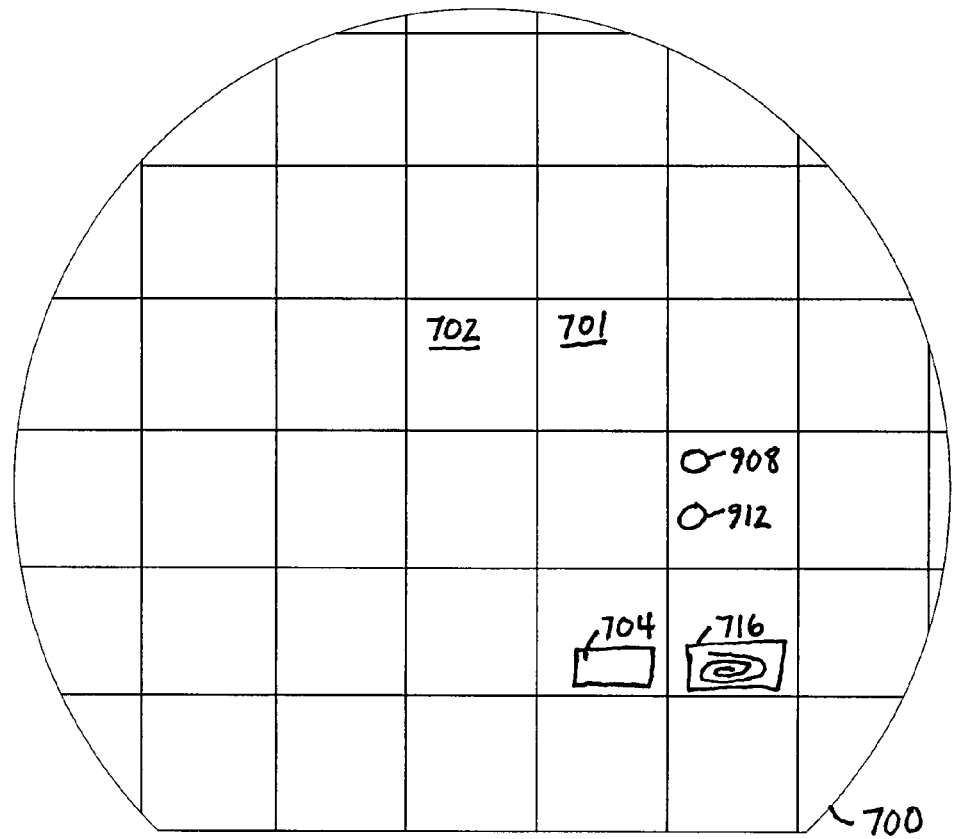
FIG. 7 illustrates a top view of an illustrative wafer comprised of multiple dies having different testing operations, in accordance with various embodiments of the invention.

FIG. 7 illustrates an example of a wafer 700 that is configured for testing from a wafer carrier. Wafer 700 is shown as comprised of multiple dies such as die 701 and die 702 represented by squares in the matrix of dies. While it is envisioned that the same data gathering system will be utilized for each die, FIG. 7 illustrates alternative data gathering methods. For example, block 704 represents a built-in self-test circuit that could be activated by direct contact of a probe articulating from the wafer carrier and contacting a power test input and test output pads on the self-test circuit. The input could activate the self-test circuit and the self-test circuit could then return a test result after activation. Similarly, block 716 illustrates a coil that could be stimulated using a wireless transmitter disposed on the wafer carrier to power a test on a particular die. Such powering is well known by those of ordinary skill in the art. Furthermore, device 908 illustrates an optical receiver that can receive a laser beam to obtain power. A test result could then be provided in return using an optical transmitter such as an LED configured as part of the circuit or coupled with the wafer. This is shown as element 912.

It is envisioned that testing can take place at any step in the manufacturing process such as those tests commonly referred to as wafer build up, material test, parametric test, optical electroscan test, final test, wafer test, and electrical test. Thus, embodiments of the invention should not be limited to a particular test process.

While various embodiments of the invention have been described as methods or apparatus for implementing the invention, it should be understood that the invention can be implemented through code coupled to a computer, e.g., code resident on a computer or accessible by the computer. For example, software and databases could be utilized to implement many of the methods discussed above. Thus, in addition to embodiments where the invention is accomplished by hardware, it is also noted that these embodiments can be accomplished through the use of an article of manufacture comprised of a computer usable medium having a computer readable program code embodied therein, which causes the enablement of the functions disclosed in this description. Therefore, it is desired that embodiments of the invention also be considered protected by this patent in their program code means as well. Furthermore, the embodiments of the invention may be embodied as code stored in a computer-readable memory of virtually any kind including, without limitation, RAM, ROM, magnetic media, optical media, or magneto-optical media. Even more generally, the embodiments of the invention could be implemented in software, or in hardware, or any combination thereof including, but not limited to, software running on a general purpose processor, microcode, PLAs, or ASICs.

It is also envisioned that embodiments of the invention could be accomplished as computer signals embodied in a carrier wave, as well as signals (e.g., electrical and optical) propagated through a transmission medium. Thus, the various information discussed above could be formatted in a structure, such as a data structure, and transmitted as an electrical signal through a transmission medium or stored on a computer readable medium.

It is also noted that many of the structures, materials, and acts recited herein can be recited as means for performing a function or steps for performing a function. Therefore, it should be understood that such language is entitled to cover all such structures, materials, or acts disclosed within this specification and their equivalents, including the matter incorporated by reference.

It is thought that the apparatuses and methods of the embodiments of the present invention and its attendant advantages will be understood from this specification. While the above is a complete description of specific embodiments of the invention, the above description should not be taken as limiting the scope of the invention as defined by the claims.

What is claimed is:

1. A method of testing wafers, said method comprising:
    providing a wafer carrier;
    disposing a wafer in said wafer carrier;
    moving said wafer carrier and said wafer between a first manufacturing location and a second manufacturing location; and
    testing said wafer while said wafer is disposed in said wafer carrier and after completion of manufacturing operations at said first manufacturing location and before manufacturing operations at said second manufacturing location.

2. The method as claimed in claim 1 wherein said testing comprises:
    testing said wafer while said wafer carrier is in transit from said first manufacturing location to said second manufacturing location.

3. The method as claimed in claim 1 wherein said testing comprises:
    utilizing test circuitry disposed on said wafer carrier.

4. The method as claimed in claim 1 wherein said testing comprises:
    utilizing a laser mounted on said wafer carrier to test said wafer.

5. The method as claimed in claim 1 wherein said testing comprises:
    utilizing a wireless transmitter mounted on said wafer carrier to transmit a wireless test signal to said wafer.

6. The method as claimed in claim 1 wherein said testing comprises:
    testing said wafer while in transit on a transportation vehicle.

7. The method as claimed in claim 6 wherein said testing comprises:
    testing said wafer while in transit on an airplane.

8. The method as claimed in claim 1 wherein said method comprises:
    transmitting a test signal from said wafer carrier to said wafer so as to initiate a test on a built-in-self-test circuit on said wafer.

9. The method as claimed in claim 1 and further comprising:
    determining a test result and storing said test result at said wafer carrier.

10. The method as claimed in claim 1 and further comprising:
    transmitting a test result determined for said wafer to a location remote from said wafer carrier.

11. The method as claimed in claim 1 and further comprising:
    determining test data for said wafer; and
    adjusting the manufacturing process based upon said test data.

12. The method as claimed in claim 11 wherein said adjusting the manufacturing comprises:
    adjusting an upstream manufacturing process.

13. The method as claimed in claim 11 wherein said adjusting the manufacturing comprises:
    adjusting downstream manufacturing processes.

14. The method as claimed in claim 11 wherein said adjusting the manufacturing comprises:
    correcting a manufacturing defect of said wafer.

15. The method as claimed in claim 1 and further comprising:
    downloading a first test routine to said wafer carrier; and
    downloading a second test routine to said wafer carrier.

16. The method as claimed in claim 15 and further comprising:
    utilizing said first test routine to test said wafer between said first and second manufacturing locations; and
    utilizing said second test routine to test said wafer between said second manufacturing location and a third manufacturing location.

17. The method as claimed in claim 15 wherein said downloading of said second test routine is completed after completion of said first test routine.

\* \* \* \* \*